(12) United States Patent
Semik (10) Patent No.: US 11,817,764 B2
(45) Date of Patent: Nov. 14, 2023

(54) DUAL POLE HIGH TEMPERATURE SUPERCONDUCTIVE PARALLEL PATH SWITCHED RELUCTANCE MOTOR

(71) Applicant: Jared M. Semik, Santa Rosa, CA (US)

(72) Inventor: Jared M. Semik, Santa Rosa, CA (US)

(*) Notice: Subject to any disclaimer, the term of this patent is extended or adjusted under 35 U.S.C. 154(b) by 27 days.

(21) Appl. No.: 17/594,155

(22) PCT Filed: Oct. 9, 2020

(86) PCT No.: PCT/US2020/070642
§ 371 (c)(1),
(2) Date: Oct. 4, 2021

(87) PCT Pub. No.: WO2021/072438
PCT Pub. Date: Apr. 15, 2021

(65) Prior Publication Data
US 2022/0173649 A1 Jun. 2, 2022

Related U.S. Application Data (60) Provisional application No. 62/913,657, filed on Oct. 10, 2019.

(51) Int. Cl.
| | | |
|---|---|---|
| H02K 55/02 | (2006.01) |
| H02K 1/24 | (2006.01) |
| H02K 16/02 | (2006.01) |
| H02K 21/44 | (2006.01) |
| H10N 60/20 | (2023.01) |

(52) U.S. Cl.
CPC ............... *H02K 55/02* (2013.01); *H02K 1/24* (2013.01); *H02K 16/02* (2013.01); *H02K 21/44* (2013.01); *H10N 60/20* (2023.02)

(58) Field of Classification Search
CPC .......... H02K 1/24; H02K 16/02; H02K 21/44; H02K 55/02; H02K 7/14; H02K 7/1838; C12Q 1/6827; C12Q 1/6869; C12Q 1/6876; C12Q 1/6883; C12Q 1/6886; C12Q 2600/156; H10N 60/20
See application file for complete search history.

(56) References Cited

U.S. PATENT DOCUMENTS

| | | | | |
|---|---|---|---|---|
| 2004/0239199 A1* | 12/2004 | Qu | .................. | H02K 21/16 310/266 |
| 2008/0161189 A1* | 7/2008 | Lewis | .................. | H02K 16/02 505/121 |
| 2013/0057091 A1* | 3/2013 | Kim | .................. | H02K 19/103 310/46 |
| 2014/0049124 A1* | 2/2014 | Gandhi | .................. | H02K 16/02 310/46 |

(Continued)

FOREIGN PATENT DOCUMENTS

| | | |
|---|---|---|
| CN | 105 515 314 A | 4/2016 |
| CN | 105 281 514 B | 1/2018 |

*Primary Examiner* — Naishadh N Desai (57) ABSTRACT

A dual pole high temperature superconductive parallel path switched reluctance motor combining high temperature superconductive wire in stator coils, a switched reluctance motor type, parallel path motor technology, and a configuration and geometry of electromagnetic coils and permanent magnets in a dual pole stator in a magnetically coupled relation to a dual annular salient rotor to create complete and continuous square, short flux path.

23 Claims, 8 Drawing Sheets

(56) References Cited

U.S. PATENT DOCUMENTS

| | | | | |
|---|---|---|---|---|
| 2016/0036366 A1* | 2/2016 | Yang | .................... | H02P 25/098 |
| | | | | 310/46 |
| 2016/0380489 A1* | 12/2016 | Sapargaliyev | ......... | H02K 21/24 |
| | | | | 310/156.02 |
| 2017/0236627 A1* | 8/2017 | Walsh | ...................... | H02K 1/12 |
| | | | | 62/51.1 |
| 2019/0267856 A1* | 8/2019 | Gandhi | .................. | H02K 16/02 |

* cited by examiner

DUAL POLE HIGH TEMPERATURE SUPERCONDUCTIVE PARALLEL PATH SWITCHED RELUCTANCE MOTOR

TECHNICAL FIELD

The present invention relates most generally to electric motors, and more specifically to electric motors with salient pole rotors and stators, and still more particularly to a permanent-magnet-assisted high temperature superconductive, switched reluctance opposing pole motor that utilizes opposing radially aligned stator poles to generate motive force, the motor especially well-suited for use as an aircraft electric motor.

BACKGROUND ART

Background Discussion

As in nearly every transportation sector, it would be desirable to migrate to the use of renewable energy sources for power rather than continuing to rely on fossil fuels. This is as true in aviation as in any sector. The U.S. EPA indicates that aircraft have been responsible for roughly 8 percent of greenhouse gases emitted in the U.S. transportation sector in recent years, and the European Commission indicates that aircraft emissions account for about 4 percent of world greenhouse gas emissions. Thus, to reduce fossil fuel consumption and the attendant emissions, and to achieve noise reduction and operating cost reductions, the use of all-electric power plants in aviation would be highly desirable.

However, it is not at all controversial to admit that aviation represents unique challenges and meaningful progress is slow in coming. Thus, the use of all-electric powerplants in aviation for primary propulsion is truly still in its nascent stages, speed and range being the principal limiting factors.

Nonetheless, because of the many advantages in shifting to all-electric power, as motor technology evolves, so too does the interest and the optimism that it will one day find a home not only in general civil aviation, but in commercial aviation and perhaps even military aviation. Success will depend on realizing dramatic improvements in the torque density and power-to-weight ratios in electric rotary motors. Setting aside important collateral issues and limitations in the specific energy of batteries, the limitations in motors are largely due to the limitations inherent in the major motor topologies.

Major motor topologies include annulus rotor brushless DC ("BLDC") motor and parallel path switched reluctance motor. Current topologies do not fully exploit available interior motor space to increase the moment arm of the rotor. Further, they do not meaningfully exploit high temperature superconductors and parallel path technology to increase magnetomotive force, nor do they utilize opposing pole geometry to increase motor torque (the natural kT factor) to drastically decrease the input energy needed to rotate the motor at a torque required for a high volume aviation fan.

Electrically powered aircraft require highly efficient, lightweight, high thrust motors, and there is thus a need for a motor that fully incorporates and exploits the foregoing features. It is to these objectives that the present invention is directed; and it is these objectives that the present invention achieves.

DISCLOSURE OF THE INVENTION

The present invention is a novel motor type and topology optimized to approach the technical limits in the art to dramatically improve aviation electric motor torque density and efficiency. To achieve such fundamental characteristics, the present invention is a permanent-magnet-assisted high temperature superconductive, switched reluctance opposing pole motor that utilizes radially aligned poles in a radial motor geometry to generate motive force. The motor uses the high current density of cuprate (e.g., YBCO or BSCCO) high-temperature superconductor coils to draw additional flux from circumferentially aligned permanent magnets positioned on both the north and south sides of the stator and in alignment with high-magnetic-saturation alloy salient rotor poles (such as Hiperco® 50 and Hiperco® 50 HS poles). [HIPERCO is a registered trademark of Westinghouse Electric & Manufacturing Company, East Pittsburgh, Pa.]

The configuration and geometric alignment of the electromagnetic coils and the permanent magnets in the stator create a parallel path magnetic flux across dual annular salient rotor poles such that the pole species (N or S direction) complement one another to give rise to a completed mutually attractive circuit in a short flux path. This strengthens the attractive force and decreases the core distance losses typically associated with a long flux path through a medium such as soft magnetic iron or cobalt steel. This is similar to the topology of a switched reluctance motor based on a short flux path; however, the inventive topology also resides in the unique configuration of alignments of both permanent and electro-magnets to create a continuous square flux loop that allows for a complimentary use of the ambient flux of the permanent magnet individual pole species.

Thus, seen in an essential aspect, the inventive dual pole high temperature superconductive parallel path switched reluctance motor of the present invention combines a novel motor topology and geometry with well-known prior art features, characteristics, and functions. The known features and functions include (1) high temperature superconductive wire (HTS wire) in the electric motor coils and coupled to a power supply, the HTS wire employed instead of traditional enameled copper and silver wiring, and thereby providing zero resistance to current and zero current impedance to decrease stator resistance loss, stator $I^2R$, or copper losses within the coils, to raise current density, and to increase torque production efficiency; (2) a switched reluctance motor (SRM) type, which uses an attractive rather than a repulsive force of a salient (passive) stator pole to induce rotation in the rotor; (3) parallel path motor technology (PPMT), or flux switching principles, which exploits the flux of a plurality of permanent magnets, each oriented typically perpendicular to the desired flux flow direction of an electromagnet and inlaid into a stator pole, wrapped in the EM coil to contribute to the flux created by the coil, whereupon when energizing the coil the resultant ambient flux of the permanent magnet is drawn into a parallel path with the electromagnetic flux and is proportionately included in the resultant usable magnetic flux force, thereby increasing useable torque per unit current; and (4) a short flux path to increase core response and to decrease the losses resulting from a long travel path of the magnetic flux through a medium, which in the inventive system preferably comprises soft magnetic iron or cobalt steel.

These four known features and functions are combined with a novel configuration and geometry of electromagnetic coils and the permanent magnets in a dual pole stator in a magnetically coupled relation to a dual annular salient rotor to create complete and continuous square, short flux path.

This combination is not merely a unique topology, but provides a motor with significantly improved performance. Specifically, the switched reluctance topology eliminates back EMF losses, and the flux switching (based on the switched reluctance topology) increases the flux force for a comparable current penalty, thus increasing both efficiency across the torque/speed curve and the Kt value of the motor, or the current-specific torque density.

In embodiments, the inventive motor can be seen as a switched reluctance motor that includes (1) a dual pole stator disposed in a stationary position about a central axis, the stator having a plurality of paired opposing inner and outer salient stator poles, the inner salient stator poles extending toward the central axis, the outer salient stator poles extending away from the central axis; (2) wire wrapped about each of the stator poles to form stator coils; an inner annular rotor concentrically and rotatably disposed around the central axis in a magnetically coupled relationship to the stator, the inner annular salient pole rotor having a plurality of evenly spaced salient poles extending toward the stator; (3) an outer annular rotor concentrically and rotatably disposed around the central axis in a magnetically coupled relationship to the stator, the outer annular salient pole rotor having a plurality of evenly spaced salient poles extending toward the stator; (4) a coupling device mechanically connecting the inner and outer rotors and synchronizing their rotation when operated; and (5) a plurality of permanent magnets disposed in the stator and configured to form pole groups during operation, the pole groups including pairs of adjacent opposing inner and outer salient stator poles and a plurality of permanent magnets, such that the permanent magnets and the inner and outer salient stator poles produce an axially symmetric mutually generative short flux path.

Seen in another aspect and in embodiments, the inventive motor is seen to comprise a dual pole stator disposed in a stationary position about a central axis, the stator having a core and a plurality of paired opposing inner and outer salient stator poles, the inner salient stator poles disposed on an inner annular side of the stator and the outer salient stator poles disposed on an outer annular side of the stator; stator coils including high temperature superconductive (HTS) wire coiled around each of the stator poles; dual rotors, including an inner annular salient pole rotor concentrically disposed around the central axis in a magnetically coupled relationship to the stator, the inner annular salient pole rotor having a plurality of evenly spaced salient poles on an outer side extending away from the central axis and toward the stator, and an outer annular salient pole rotor concentrically disposed around the central axis in a magnetically coupled relationship to the stator, the outer annular salient pole rotor having a plurality of evenly spaced salient poles on an inner side extending toward the central axis and the stator; a combining plate mechanically connecting the inner and outer annular salient pole rotors and synchronizing their rotation so as to apply their torque in combination when operated; and a plurality of arc segment permanent magnets disposed in the stator core along a circumferential radius of the stator between each of the pairs of opposing inner and outer salient stator poles; wherein the permanent magnets and the inner and outer salient stator poles form a pole group, such that when the stator poles are energized, magnetic flux is induced and redirects and complements the ambient permanent magnetic flux to create a short flux path, and more specifically a closed and continuous axially symmetric, mutually generative and additive square short flux path including that increases the magnetomotive force available to drive the rotors.

Summarily, and stated slightly differently, the combination of known features with the novel complimentary square path topology created by geometry of the dual pole stator and dual annular salient rotor creates a synergy in the component elements by adding the loss reductions as increases and by increasing the generated force required to induce torque per a given unit current.

Because of this unique combination of features, the inventive motor may be characterized as a dual pole high temperature superconductive parallel path switched reluctance motor, acronymically DPHTSPPSRM.

In embodiments, entirely non-limiting, the inventive motor may be implemented as an all-electric motor in aerospace powerplants in either push or pull configurations.

BRIEF DESCRIPTION OF THE DRAWINGS

The invention will be better understood and its various objects and advantages, other than those set forth above, will become apparent when consideration is given to the following detailed description. The description refers to the annexed drawings, wherein.

DETAILED DESCRIPTION OF THE INVENTION

Referring first to FIGS. 1 through 8, wherein like reference numerals refer to like components in the various views, there is illustrated therein a new and improved dual pole high temperature superconductive parallel path switched reluctance motor, generally denominated 10 herein. [While terms orienting the views include "front", also meaning herein the fore or "anti-mount" side, as well as "rear," also meaning the aft or "mount" side, these are for orienting the views only. It will be understood that in aerospace implementations as a power plant, the motor may be mounted for propulsion in either a push or a pull configuration, with operational and mechanical components and features being, in all material respects, identical.]

In these views there is shown an electric motor with a unique topology and geometric confirmation. The motor includes an electromagnetic permanent magnet assisted stator core 12 configured with a plurality of permanent magnets, including alternating short arc magnet segments 14 and long arc magnet segments 16, inserted into alternating core cavities (pockets or sleeves) 18 and 20, respectively [best seen in FIG. 7], in the stator core. The magnets are rare earth arc segment magnets magnetized through their respective circumferences along their respective midlines 22, 24, which are oriented toward the motor central axis 50. The permanent magnets are circumferentially aligned along their medial radius 26, 28 with a stator medial radius 30 and substantially normal to the radial axis 52. In embodiments, the magnets are N52 NdFeB rare earth magnets. They are all oriented with their south poles leading in the direction of rotation of the rotors and the north poles trailing (discussed below).

The stator includes a plurality of poles, each magnetically active stator pole consisting of a pair of opposing electromagnetic pole components, inner poles 32 disposed on the inner annular side 12a of the stator and extending toward the central axis, and outer poles 34, disposed on the outer annular side 12b of the stator and extending away from the central axis. Thus, the inwardly oriented and outwardly oriented salient stator poles form opposing pairs 32/34, each individual electromagnetic pole component protrusion being bobbin wound with cuprate high temperature superconducting magnet coil wire 36 [see FIG. 8], which together form a pole group with redirects ambient flux from three adjacent circumferentially oriented permanent magnets, configured in series, into parallel radial flow paths about the center axis of the respective electromagnetic coils. (Windings are implied but not shown in the schematic views of FIGS. 1-4.) Stator salient poles may be skewed to reduce torque ripple. The stator core material is preferably a magnetically annealed HiperCo 50A (or a material having equivalent specifications).

Figure 1:
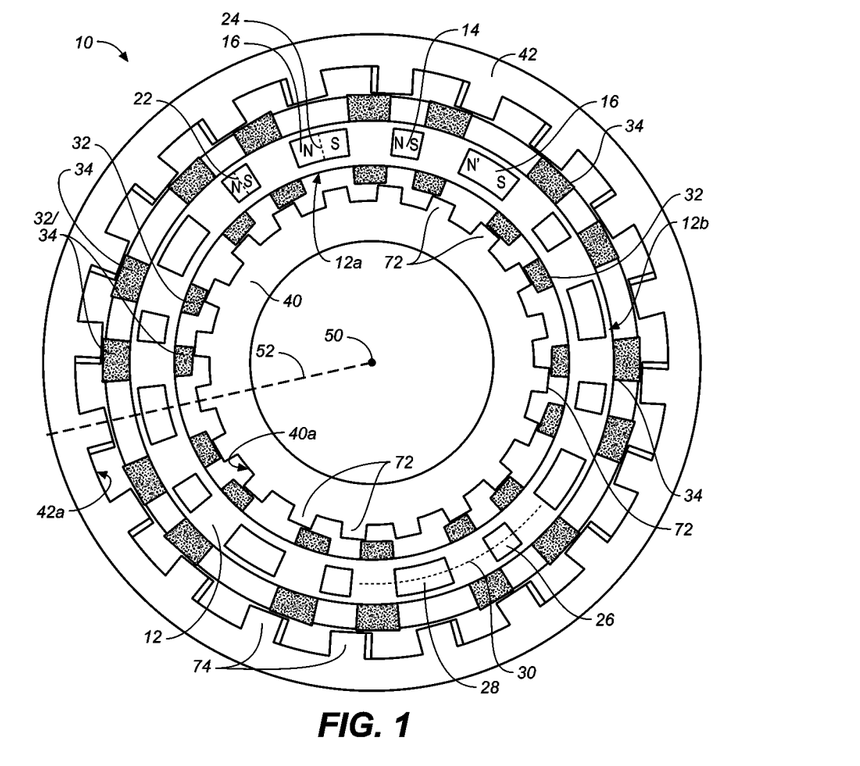
FIG. 1 is a rear (mount) side view in elevation showing the motor core assembly of the present invention, with its motor housing removed to feature the motor core components, including inner and outer annular rotors axially disposed around the stator.
Figure 2:
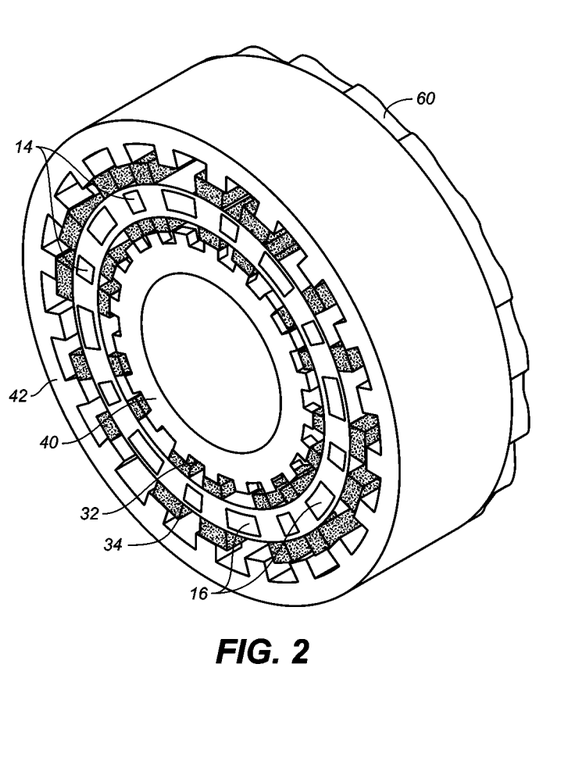
FIG. 2 is an upper rear (mount) view in elevation thereof.
Figure 3:
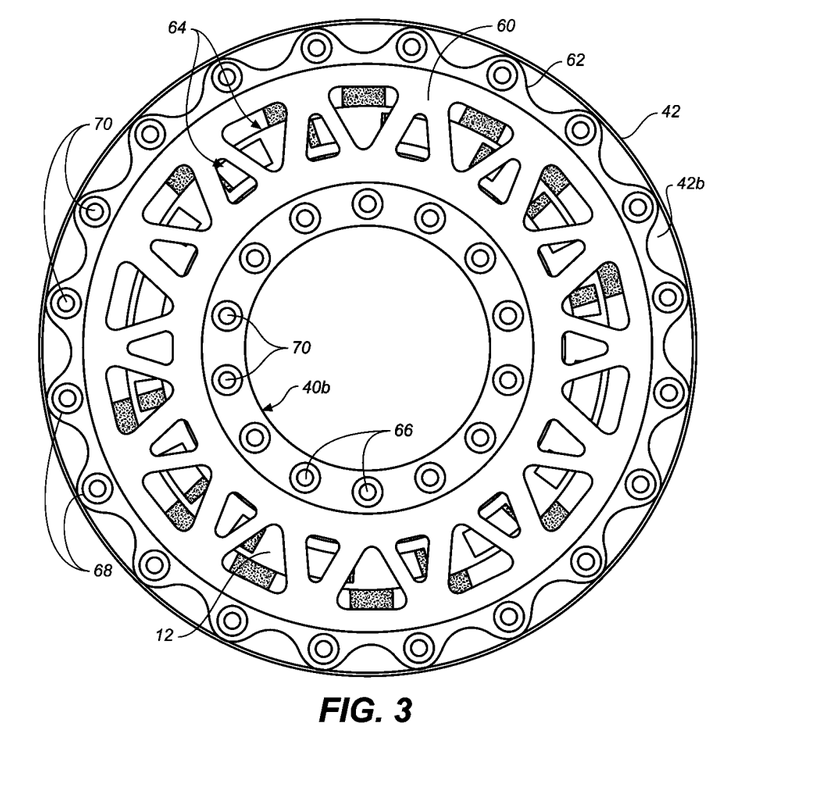
FIG. 3 is a front (anti-mount) side view in elevation thereof, the view featuring the rotor combining plate (coupling hub) which mechanically couples the inner and outer annular rotors.
Figure 7:
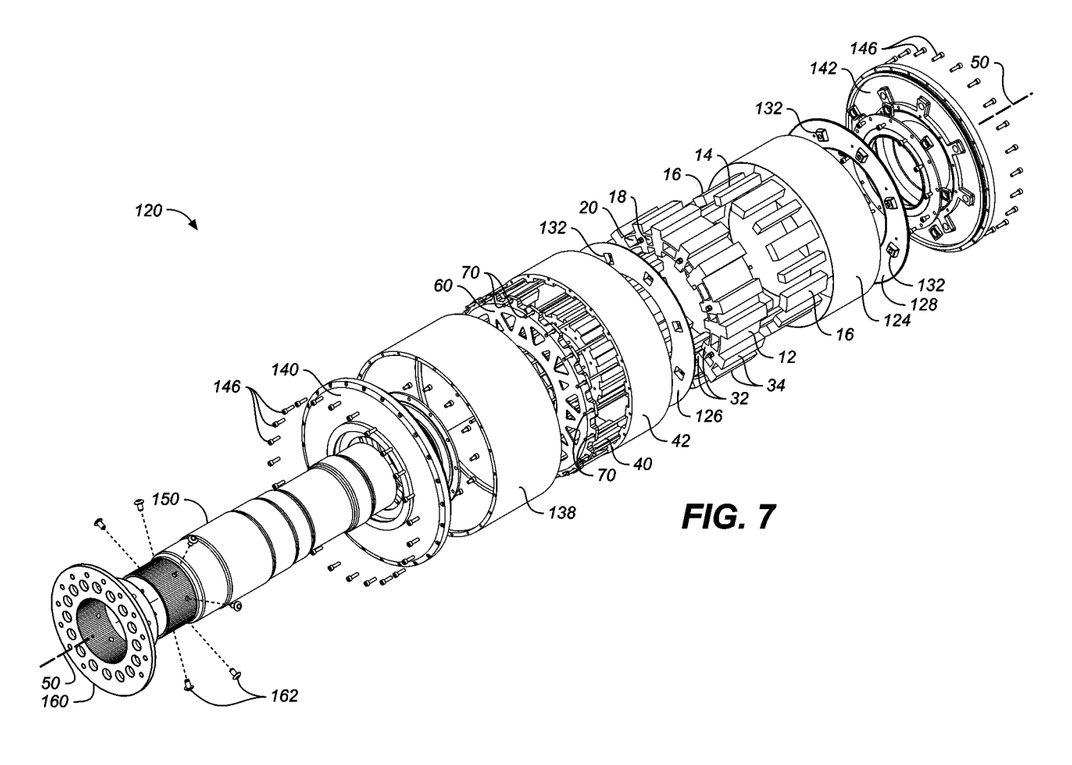
FIG. 7 is an exploded front (anti-mount) perspective view showing the inventor motor incorporated in a complete motor assembly.
Figure 8:
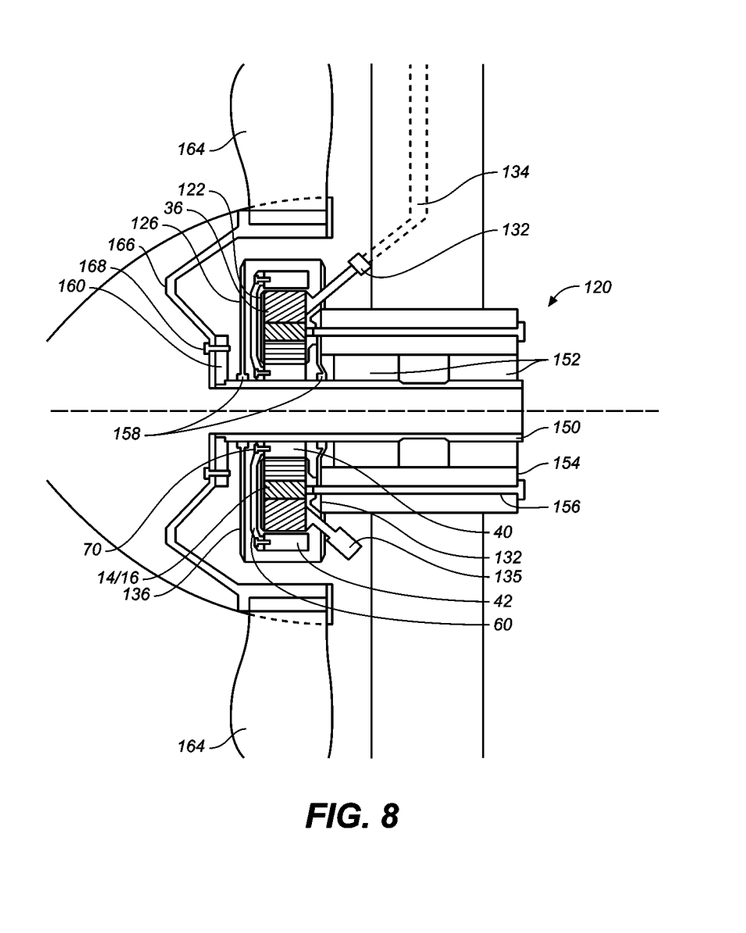
FIG. 8 is a schematic cross-sectional side view in elevation showing details of the motor embodied as a powerplant for an aerospace propeller motor, showing mounting structure, a nose cone carriage and nose cone structure, and a propeller blade.

The assembly next includes an inner annular salient pole rotor (or inner rotor ring) 40 and an outer annular salient pole rotor (or outer rotor ring) 42, the inner and outer rotor rings mechanically connected to one another with a mechanical link, such as a connecting hub or combining plate 60 [see FIGS. 3, 7-8], bolted or otherwise fastened to the inner rotor ring front sidewall 40b (not showing in the views) and the outer rotor ring front sidewall 42b. Each of the inner and outer rotor rings are, in turn, fastened to the drive shaft 150, which provides axial alignment and concentricity relative to one another and to the stator core. The combining plate includes an undulating edge 62 and cutouts 64 to reduce weight. Inner bolt holes 66 and outer bolt holes 68 enable bolts 70 to be passed through to the rotor sidewalls.

Inner rotor poles 72 and outer rotor poles 74, also preferably skewed to reduce torque ripple, are put into and maintain in alignment through the combining plate. Insofar as a switched reluctance motor topology is employed, there are no permanent magnets or coils on the rotor poles.

Figure 4:
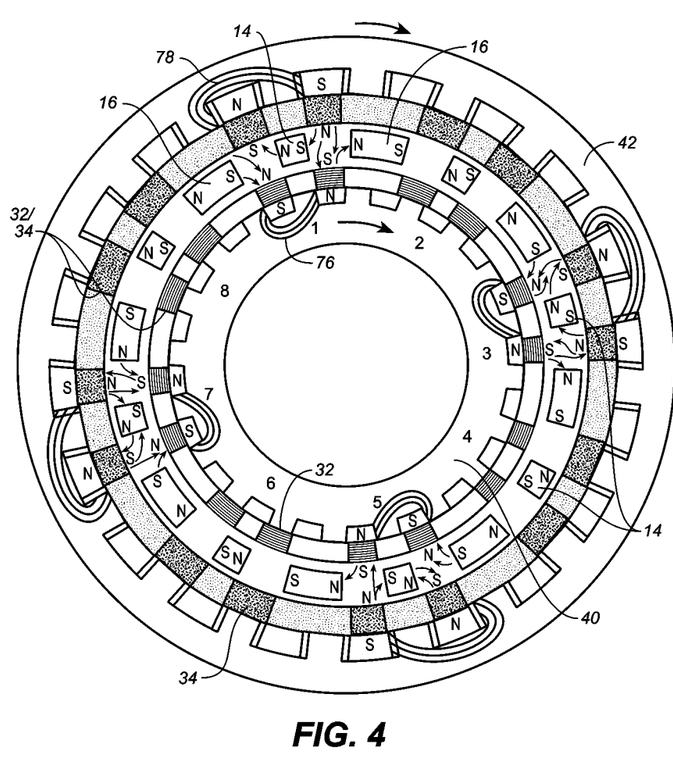
FIG. 4 is a schematic rear side view in elevation showing the flux path diagram of the motor core rotor and stator subassemblies.

A short path salient rotor pole, opposing stator pole, flux switching, switched reluctance motor theory of operation is schematically illustrated in FIG. 4. As can be seen, when energized, each magnetically active stator pole consists of two opposing electromagnetic pole components 32, 34, redirecting ambient flux from 3 adjacent circumferentially oriented permanent magnets in series 14, 16, into parallel radial flow paths 76, 78 about the center axis of the respective electromagnetic coils.

Figure 5:
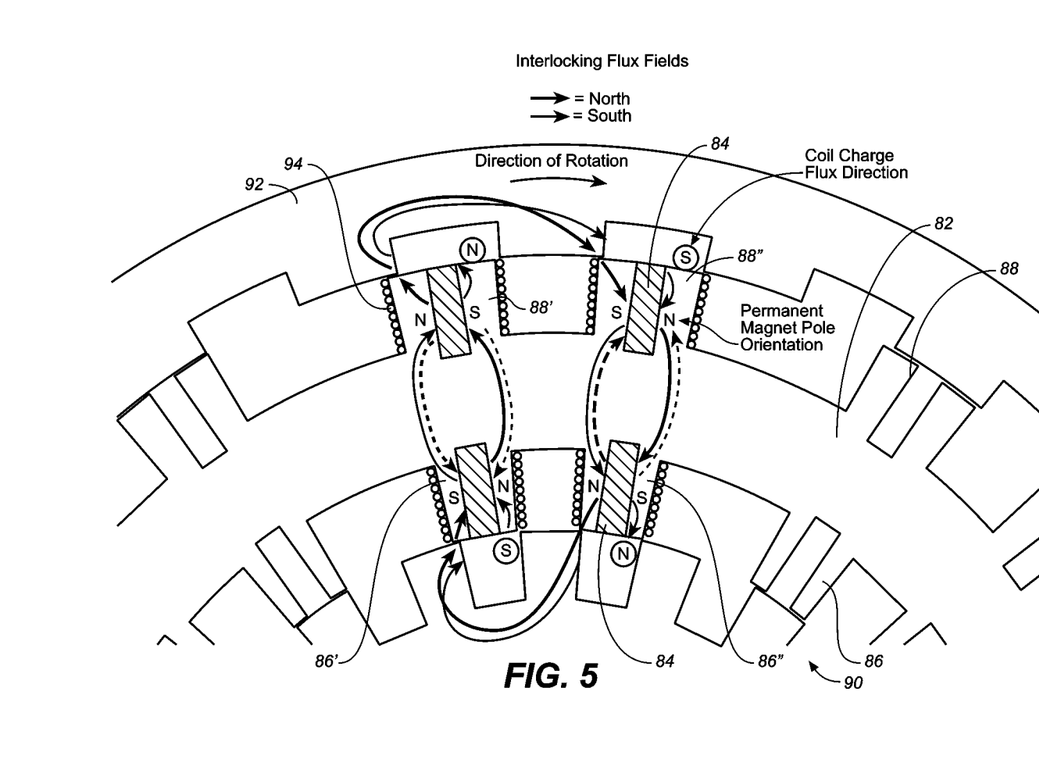
FIG. 5 is a detailed schematic rear side view in elevation showing an alternative embodiment of the inventive motor core, this view showing permanent magnets disposed in the salient stator poles rather than in the stator core and showing the flux path when the rotor and stator poles are substantially unaligned, and thus with maximum magnetic reluctance.
Figure 6:
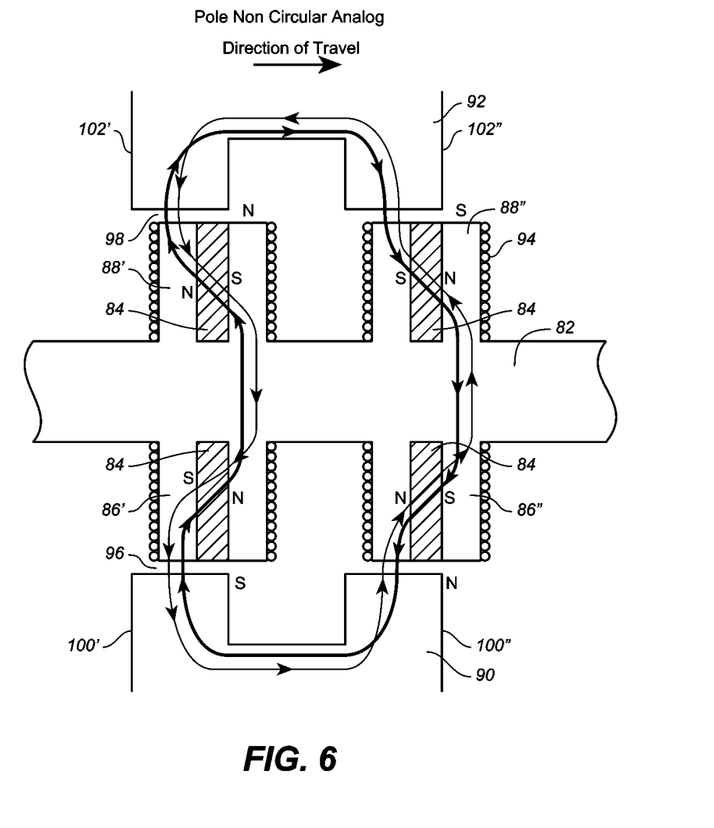
FIG. 6 is a more detailed view in the same orientation showing the complete and continuous short path square flux loop when the stator and rotor poles come into near alignment.

In an alternative embodiment 80, FIGS. 5-6, the dual opposing pole stator 82 is configured with permanent magnets 84 disposed in each of the inner and outer poles, 86, 88, respectively, with their magnetization in the longest dimension. The pole orientation of magnets in the inner poles 86 is reversed relative to the orientation of magnets in the opposing outer pole 88. Thus, inner poles 86' having leading south poles (i.e., facing in the direction of rotor rotation) are matched with an opposing outer pole 88' with a magnet having a leading north pole. Neighboring pairs of inner and outer poles 86", 88", have magnets with the orientations reversed. This embodiment pairs with inner and outer salient pole annular rotors, 90, 92, respectively, configured identically to those of the embodiment of FIGS. 1-4. Likewise, with respect to the switched superconductive high temperature coils 94. The opposing stator poles are energized concurrently. When the coil is energized, flux (arrows) is induced and renders the poles effective magnetic poles, reversing direction on switching, and passes in a square short flux loop through the outer stator pole 88', including the magnet 84, across the outer air gap 98 through outer rotor pole 102', across to and through the neighboring outer rotor pole 102", again across the outer air gap 98, through the neighboring outer stator pole 88", through the stator core and the inner stator pole 86", across the inner air gap 96, through the proximate inner rotor pole 100" to neighboring inner rotor pole 100', across the inner air gap 96, through the inner stator pole 86' and magnet and up to the upper stator pole 88' to complete the continuous short flux path. In the unaligned position (stator and rotor salient poles unaligned), FIG. 5, magnetic reluctance is maximum, while in the aligned position, FIG. 6, reluctance is at the minimum.

In each embodiment, the permanent magnets in the stator pull flux lines from the electromagnetic coils into parallel paths that cooperate with the rotor salient poles to create short and continuous square flux loop.

Looking now at FIG. 7, there is shown in an exploded upper front perspective view the above-described motor incorporated into a motor assembly 120.

FIG. 8 is a cross-sectional side view in elevation of how the motor topology and the motor assembly may be employed in a practical, non-limiting implementation. Its integration into an airframe structure must be generalized, as the under-wing, over-wing, nose cone and aft-push configurations are known, as are myriad mounting techniques.

As seen in this view, the combining plate 60 couples the inner and outer annular rotors, 40, 42. The dual pole stator is enclosed in a cryogenic chamber 122 constructed from magnetically transparent metal, which includes a cryogenic chamber enclosure ring 124 and mount side and anti-mount side enclosure plates, 126, 128. This provides an axial mounting mechanism and contains fluid at cryogenic temperatures (e.g., liquid nitrogen, $LN_2$) to keep the stator operator at temperatures between 63 and 77.2 K. The contact mount surface/interface is constructed of high porosity ceramic or aerogel insulators 130. Cryogenic fluid is introduced into the chamber via quick-disconnect fill port fittings 132 in fluid communication with $LN_2$ feed lines 134, comprising part of cryogenic fluid circulation system 135, shown only partially and schematically as they are generic, design dependent, and well known.

The stator and rotor assembly, itself enclosed in a cryogenic chamber, is then enclosed in a vacuum chamber enclosure 136 comprising a vacuum chamber enclosure ring 138 and front and rear enclosure plates, 140, 144 secured with enclosure fasteners 146.

The vacuum chamber and enclosed stator/rotor core are soft mounted to one another (i.e., they are not fastened, but are subassemblies assembled together according to the figure), and the resulting subassembly is mated with the rotor shaft subassembly.

The drive shaft 150 is journaled in two bearings 152 encircling the drive shaft, which is in turn inserted into and affixed in the mount ring 154.

The core/enclosure assembly is mated with the mount ring 154 with mount bolts 156 and aligned.

Summarily, the motor system is mounted within a cryogenic chamber. In operation, the cryogenic chamber is flooded with liquid nitrogen via the cryogenic chamber fill ports 132. The chamber is kept at approximately 70K by a cryogenic cooling pump—either a Stirling type or adiabatic demagnetization cryopump (ADC) 135—in contact with the liquid nitrogen at the lowest gravitational point of the enclosure, which is circulated using a cryogenic liquid pump to maintain a homogenous chamber temperature of approximately 70K. This also maintains the high temperature superconductor coils below the superconductivity temperature of 90K.

The vacuum chamber 136 is mounted to the mounting ring 154 which maintains the concentricity of the motor and operation system components. The inner annular rotor 40 is affixed to the drive shaft 150 and bearings 152 and is actively sealed by a liquid ferrofluid seal 158. The ferrofluid seal maintains the vacuum within the vacuum chamber. Chamber monitors for both the vacuum and cryogenic chambers send signals to a motor system controller to maintain vacuum pressures via the vacuum pump and cryogenic temperatures via heat and circulation pumps, respectively.

A drive flange 160 is connected to the drive shaft 150 with mounting rivets 162. In an aerospace implementation, propeller blades 164 disposed about a nose cone carriage 166 may be coupled to the drive flange with bolts 168. An IR reflective coating 170 may be employed on the vacuum chamber to resist radiant heat energy transfer into the cryogenic chamber.

Motor System Operation (Including Motor Core, Cryogenic and Dewar Vacuum Systems):

Thus, from the foregoing it is see that the combined magnetomotive force from the opposing electromagnetic pole components and adjacent circumferentially oriented permanent magnets is directed through both inner and outer salient rotor poles, creating a magnetic attractive force in the tangent direction of the rotor circumference and thereby generating a mechanical torque.

As the combined salient rotors advance around the circumference towards magnetic and mechanical alignment with the active magnetized stator poles (4 per impulse cycle, 8 total), advancement of the next sequential set of salient rotor poles enters into proximity with the next sequential inactive magnetic stator poles. [Seen most clearly by reference to FIG. 6.] At that time the active stator poles de-energize and the inactive array energize, repeating the torque advancement of the rotor. As discussed more fully below, the superconductive high temperature wires and the stator is enclosed in a cryogenic chamber. Magnetic flux energy from the stator core is passed through the cryogenic chamber walls to the salient rotor assembly poles resulting in mechanical rotation and torque.

The inner and outer annular rotors are mounted concentrically relative to the cryogenic chamber housing, the stator core, and within an enclosed vacuum chamber. This configuration maintains both a convective heat barrier and eliminates motor windage losses. The exterior of the cryogenic chamber is coated with an infrared reflective coating to reduce or eliminate the transfer of radiant heat energy to reduce the need for heat removal from the cryogenic cooling system and the cryogenic chamber.

The inventive motor can be implemented in myriad applications that require an enhanced torque/power density/efficiency and can house the volume of the motor system. The motor technology is volumetrically scalable to both integer and decimal multiples.

Features and Purposes:

The inventive dual pole, high temperature superconductive, parallel path, switched reluctance motor of the present invention includes the following features and is directed to the following objectives:

Flux Switching:

The motor uses electromagnetic force to draw ambient permanent ferro magnetic flux into use in multiplying the motor pole magnetomotive force.

Inner and Outer Salient Rotor (Switched Reluctance, Non-Permanent Magnets):

The motor configuration produces axially symmetric flux paths that are mutually generative. By eliminating permanent magnets from the rotor and confining them to the stator, construction complexity is reduced, rotor inertial moment is reduced, and back emf is eliminated. This geometry also increases the torque moment of the motor.

Superconductive Coils:

High temperature superconductive wires in the coils energized in a cryogenic chamber increase available current density by eliminating electrical resistance. This allows for the use of smaller gauge wire, thereby enabling higher currents and providing room for a greater number of turns. With $F=nIL \times B$, this increases both the "n" constant and available "I" expressions. It provides more electromotive force by allowing a greater density of turns for less loss in current.

The vacuum chamber reduces the inherent motor windage losses by eliminating the exposure to gases that act as a "wind load" to the rotating components of the motor.

The symmetry of the motor design eliminates switching losses as the poles do not require a pole reversal to create electromagnetic rotation of stator poles. The rotor advances by a single salient tooth into a series stator pole in a short flux path configuration, which increases available magnetic flux energy density. Due also to the symmetry is an energization of four 90 degree offset pole sets further increasing torque and reducing winding complexity. By selecting low retentivity steels, resistance to magnetomotive attraction is reduced for advancing salient rotor poles.

From the foregoing, it is seen that in embodiments the inventive motor includes (a) a stator core constructed from soft magnetic high saturation flux density low retentivity steel lamination or solid core, the stator disposed in a stationary position about a central axis and having a plurality of opposing inner and outer salient poles disposed on both an inner annular side and an outer annular side; (b) inner and outer annular salient pole rotors (rotor rings) concentrically disposed around the central axis in a magnetically coupled relationship to the stator, the inner rotor having a plurality of evenly spaced salient poles on an outer side and extending away from the central axis and toward the stator, the outer rotor having a plurality of evenly spaced salient poles on an inner side and extending toward the stator and the central axis; (c) a rotor hub or plate mechanically connecting the inner and outer annular rotors to one another, the hub coupling the concentricity of the rotor rings and synchronizing their rotation and thereby concurrently applying torque from each rotor to the drive shaft; (d) wherein the inner rotor ring is a magnetic salient pole annulus ring of soft magnetic iron or steel, with its axial direction of flux from the stator pole; (e) and wherein the concentric outer rotor ring is also a magnetic salient pole annulus ring of soft magnetic iron or steel, with its axial direction of flux from the stator pole; (f) a vacuum enclosure, which is a multi-piece stainless steel housing capable of withstanding and retaining vacuum pressures; (g) a vacuum chamber providing an anti-convection thermal barrier between the temperature differential of a cryogenic chamber and outside ambient heat; (h) alternating short and long arc segment permanent magnets (preferably NdFeB) disposed in circumferential alignment along a medial radius of the stator core, the magnets adding magnetomotive force through flux switching; (i) high temperature superconductor zero resistance coil wire providing zero current impedance and raised current density, thereby raising the associated electromagnetic flux force; (j) a magnetically permeable steel cryogenic chamber enclosing the stator and rotor motor core, the cryogenic chamber consisting of an enclosure to contain cryogenic fluid (e.g., liquid nitrogen, $LN_2$); (k) an integrated cooling system comprising Stirling or ADC cryogenic cooler element(s) with a cryogenic fluid circulation system for use in maintaining cryogenic temperatures to 70K; (l) positional and load bearing bearings to bear the rotational and gyroscopic forces during operation and to provide true position of the salient rotors to the motor stator core; (m) an $LN_2$ fill port, which is a channel for filling the cryogenic chamber with cryogenic fluid from a supply external to the chamber; (n) IR reflective coating for resistance to radiant heat energy transfer into cryogenic chamber; (o) liquid ferrofluid shaft seals for maintaining a low friction vacuum seal between the vacuum chamber and ambient components; (p) a motor mount ring for maintaining the motor force loads and to position the dynamic rotor components with respect to the air flow channel; and (q) a porous ceramic or Aerogel mount insulator providing a thermal barrier through the mount surface.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

More specifically, in embodiments the first the motor can operate with either the outer or inner salient rotor alone. In such an embodiment, the motor will not be as torque dense as the dual rotor design, but the design concept nonetheless applies.

In yet another embodiment, the electromagnetic poles can be "coreless," meaning they do not need to be wound around a soft magnetic core but instead can be wound unrestrained and potted or epoxied in alignment with the effective pole direction. This serves several purposes: it aids in mitigating torque ripple, and it eliminates reaching saturation flux density.

In still another embodiment, the salient poles can be "skewed" or oriented in a low twist helix, which also reduces cogging or torque ripple.

What is claimed as invention is:

1. A dual pole parallel path switched reluctance motor, comprising:
    an annular dual pole stator disposed in a stationary position about a central axis, said stator having a core and paired opposing inner and outer salient stator poles each having windings to form stator coils, said inner salient stator poles disposed on an inner annular side of said stator core and extending toward said central axis, said outer salient stator poles disposed on an outer annular side of said stator core and extending away from said central axis;
    an inner annular salient pole rotor concentrically disposed said central axis in a magnetically coupled relationship to said stator with evenly spaced salient poles on an outer side extending away from said central axis and toward said stator;
    an outer annular salient pole rotor concentrically disposed said central axis in a magnetically coupled relationship to said stator with evenly spaced salient poles on an inner side extending toward said central axis and said stator;
    a mechanical coupler disposed between and connecting said inner and outer annular salient pole rotors and synchronizing their rotation to apply their torque in combination when operated; and
    a plurality of magnets disposed in said stator;
    wherein said permanent magnets and said inner and outer salient stator poles form a pole group, such that when said stator poles are energized, the polarity of paired inner and outer stator poles is oriented in the same direction and is the opposite of the polarity of any adjacent paired inner and outer stator poles, and a magnetic flux is induced that redirects and complements the ambient permanent magnetic flux to create a closed and continuous short flux path to drive said rotors.

2. The dual pole parallel path switched reluctance motor of claim 1, wherein when energized, each of said stator poles are magnetically active and redirect ambient flux from adjacent permanent magnets into parallel radial flow paths about a center axis of their respective stator coils.

3. The dual pole parallel path switched reluctance motor of claim 1, wherein said stator is either solid or is a laminated construction using soft magnetic high saturation flux density low retentivity steel.

4. The dual pole parallel path switched reluctance motor of claim 1, wherein said windings are bobbin wound and formed with cuprate high temperature superconductive wire.

5. The dual pole parallel path switched reluctance motor of claim 1, further including a vacuum enclosure housing said stator and said rotors, said vacuum chamber in fluid communication with a vacuum system through fluid vacuum lines.

6. The dual pole parallel path switched reluctance motor of claim 1, wherein each of said inner and outer annular salient pole rotors are fabricated from soft magnetic iron or steel.

7. The dual pole parallel path switched reluctance motor of claim 1, wherein said plurality of magnets includes arc segment magnets.

8. The dual pole parallel path switched reluctance motor of claim 7, wherein said arc segment magnets are diametrically magnetized across their circumference and are placed with their south poles oriented in the direction of travel of said inner and outer annular salient pole rotors.

9. The dual pole parallel path switched reluctance motor of claim 8, wherein said arc segment magnets include short arc segments and long arc segments arranged in an alternating series.

10. The dual pole parallel path switched reluctance motor of claim 1, wherein each of said inner and outer annular salient pole rotors have an axial direction of flux from said stator poles.

11. The dual pole parallel path switched reluctance motor of claim 1, wherein each of said inner and outer annular salient pole rotors are operatively coupled to a drive shaft.

12. The dual pole parallel path switched reluctance motor of claim 1, further including a sealed cryogenic chamber enclosing said stator, said cryogenic chamber having an interior volume in fluid communication with a cryogenic fluid circulation system.

13. The dual pole parallel path switched reluctance motor of claim 12, wherein said cryogenic chamber is fabricated from magnetically transparent metal such that magnetic flux energy from said stator passes through said cryogenic chamber to said inner and outer annular salient rotors resulting in mechanical rotation and torque.

14. The dual pole parallel path switched reluctance motor of claim 13, wherein said vacuum enclosure encloses said cryogenic chamber to provide an anti-convection thermal barrier between said cryogenic chamber and heat outside said motor, said vacuum chamber in fluid communication with a vacuum system through fluid vacuum lines.

15. The dual pole parallel path switched reluctance motor of claim 1, wherein said permanent magnets are rare earth magnets.

16. The dual pole parallel path switched reluctance motor of claim 1, wherein said permanent magnets are inserted into sleeves formed in said stator core.

17. The dual pole parallel path switched reluctance motor of claim 1, further including a drive shaft to which said inner and outer annular salient rotor are coupled, said drive shaft journaled in two bearings encircling said drive shaft and supported in a mount ring on which said vacuum chamber is mounted.

18. The dual pole parallel path switched reluctance motor of claim 1, wherein the combined magnetomotive force from said opposing inner and outer stator poles and adjacent pairs of permanent magnets is directed through both inner and outer salient rotor poles, creating a magnetic attractive force in the tangent direction of the rotor circumference to generate a mechanical torque.

19. The dual pole parallel path switched reluctance motor of claim 1, wherein the configuration of the combined stator and inner and outer annular salient pole rotors produces axially symmetric flux paths that are mutually generative, reducing rotor inertial moment and back electromagnetic force and increasing torque moment.

20. The dual pole parallel path switch reluctance motor of claim 1, wherein said mechanical coupler is a combining plate bolted to each of said inner and outer annular salient rotors.

21. A motor, comprising:
a dual pole stator disposed in a stationary position about a central axis, said stator having a core and a plurality of paired opposing inner and outer salient stator poles, said inner salient stator poles disposed on an inner annular side of said stator and said outer salient stator poles disposed on an outer annular side of said stator;
stator coils including high temperature superconductive (HTS) wire coiled around each of said stator poles;
dual rotors, including an inner annular salient pole rotor concentrically disposed around said central axis in a magnetically coupled relationship to said stator, said inner annular salient pole rotor having a plurality of evenly spaced salient poles on an outer side extending away from said central axis and toward said stator, and an outer annular salient pole rotor concentrically disposed around said central axis in a magnetically coupled relationship to said stator, said outer annular salient pole rotor having a plurality of evenly spaced salient poles on an inner side extending toward said central axis and said stator;
a combining plate mechanically connecting said inner and outer annular salient pole rotors and synchronizing their rotation so as to apply their torque in combination when operated; and
a plurality of arc segment permanent magnets disposed in said stator core along a circumferential radius of said stator between each of said pairs of opposing inner and outer salient stator poles;
wherein said permanent magnets and said inner and outer salient stator poles form a pole group, such that when said stator poles are energized, magnetic flux is induced and redirects and complements the ambient permanent magnetic flux to create a closed and continuous short flux path that increases the magnetomotive force available to drive said rotors.

22. The motor of claim 21, wherein said dual pole stator is in a magnetically coupled relation to said dual rotors to create complete and continuous square, short flux path.

23. A switched reluctance motor, comprising:
a dual pole stator disposed in a stationary position about a central axis, said stator having a plurality of paired opposing inner and outer salient stator poles, said inner salient stator poles extending toward said central axis, said outer salient stator poles extending away from said central axis;
wire wrapped about each of said stator poles to form stator coils;
an inner annular rotor concentrically and rotatably disposed around said central axis in a magnetically coupled relationship to said stator, said inner annular salient pole rotor having a plurality of evenly spaced salient poles extending toward said stator;
an outer annular rotor concentrically and rotatably disposed around said central axis in a magnetically coupled relationship to said stator, said outer annular salient pole rotor having a plurality of evenly spaced salient poles extending toward said stator;
a coupling device mechanically connecting said inner and outer rotors and synchronizing their rotation when operated; and
a plurality of permanent magnets disposed in said stator and configured to form pole groups during operation, the pole groups including adjacent pairs of opposing inner and outer salient stator poles and a plurality of permanent magnets, such that said permanent magnets and said inner and outer salient stator poles produce an axially symmetric mutually generative short flux path.

* * * * *